United States Patent
Zhang

(10) Patent No.: US 10,832,614 B2
(45) Date of Patent: Nov. 10, 2020

(54) RESETTING CIRCUIT, SHIFT REGISTER, GATE DRIVING CIRCUIT AND DRIVING METHOD THEREOF, AND DISPLAY DEVICE

(71) Applicants: BOE Technology Group Co., Ltd., Beijing (CN); Hefei BOE Optoelectronics Technology Co., Ltd., Anhui (CN)

(72) Inventor: Douqing Zhang, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

(*) Notice: Subject to any disclaimer, the term of this patent is extended or adjusted under 35 U.S.C. 154(b) by 133 days.

(21) Appl. No.: 16/141,338

(22) Filed: Sep. 25, 2018

(65) Prior Publication Data
US 2019/0096313 A1    Mar. 28, 2019

(30) Foreign Application Priority Data
Sep. 27, 2017 (CN) .......................... 2017 1 0890781

(51) Int. Cl.
| | | |
|---|---|---|
| G11C 19/00 | (2006.01) | |
| G09G 3/20 | (2006.01) | |
| G11C 19/28 | (2006.01) | |
| G09G 3/36 | (2006.01) | |

(52) U.S. Cl.
CPC .............. *G09G 3/2092* (2013.01); *G09G 3/20* (2013.01); *G09G 3/3677* (2013.01); *G11C 19/28* (2013.01); *G11C 19/287* (2013.01); *G09G 2310/0267* (2013.01); *G09G 2310/0286* (2013.01); *G09G 2310/061* (2013.01); *G09G 2310/062* (2013.01); *G09G 2320/0233* (2013.01)

(58) Field of Classification Search
None
See application file for complete search history.

(56) References Cited

U.S. PATENT DOCUMENTS

| | | | | |
|---|---|---|---|---|
| 2010/0111245 | A1* | 5/2010 | Tobita | G11C 19/184 377/64 |
| 2010/0309184 | A1* | 12/2010 | Yamamoto | G09G 3/3677 345/209 |
| 2015/0380107 | A1* | 12/2015 | Chen | G09G 3/3677 345/100 |
| 2016/0027371 | A1* | 1/2016 | Hao | G09G 3/2092 345/214 |
| 2016/0240158 | A1* | 8/2016 | Xu | G11C 19/28 |

(Continued)

*Primary Examiner* — Tuan T Lam
(74) *Attorney, Agent, or Firm* — McDermott Will & Emery LLP

(57) ABSTRACT

Embodiments of the present disclosure provide a resetting circuit, a shift register, a gate driving circuit and a driving method thereof, and a display device. The first switching sub-circuit, the storage sub-circuit, the controlling sub-circuit, and the second switching sub-circuit in the resetting circuit output a first level signal to a second terminal of the resetting circuit. When a scanning frequency of the gate driving circuit is switched, a resetting function may be implemented by the resetting circuit even if there is no resetting signal provided by a resetting signal terminal for resetting a part of outputting terminals of the gate driving circuit.

20 Claims, 10 Drawing Sheets

(56) References Cited

U.S. PATENT DOCUMENTS

| | | | | |
|---|---|---|---|---|
| 2018/0254091 A1* | 9/2018 | Zhang | .................. | G11C 19/184 |
| 2019/0066617 A1* | 2/2019 | Zhao | .................... | G09G 3/3677 |
| 2019/0080780 A1* | 3/2019 | Wang | .................. | G11C 19/287 |
| 2019/0096500 A1* | 3/2019 | Gu | ........................ | G11C 19/287 |
| 2019/0189799 A1* | 6/2019 | Chun | ................ | H01L 21/26513 |
| 2019/0206294 A1* | 7/2019 | Tian | ......................... | G09G 3/20 |

* cited by examiner

_30_

```
301
transmitting the inputting signal to the storage sub-circuit through the first
switching sub-circuit, under a control of the inputting signal during a first
                            period
```

```
                                                                    302
transmitting the signal stored in the storage sub-circuit to the second
    switching sub-circuit, so as to output a signal at the first level signal
terminal to the second terminal through the second switching sub-circuit,
    under a control of the first controlling signal, during a second period
```

Fig. 3

RESETTING CIRCUIT, SHIFT REGISTER, GATE DRIVING CIRCUIT AND DRIVING METHOD THEREOF, AND DISPLAY DEVICE

CROSS-REFERENCE TO RELATED APPLICATION(S)

This application claims a priority of Chinese Patent Application No. 201710890781.X, filed on Sep. 27, 2017, the entire contents of which are hereby incorporated by reference.

TECHNICAL FIELD

Embodiments of the present disclosure relate to a field of display technologies, and in particular, to a resetting circuit, a shift register, a gate driving circuit and a driving method thereof, and a display device.

BACKGROUND

In a display device, progressive scanning on the display device can be implemented by controlling turning-on and turning-off of transistors in pixel units via a gate driving circuit. When a gate drive circuit scans progressively to the $m^{th}$ line at a scanning frequency A, a scanning frequency may be switched from A to B. At this time, a resetting signal corresponding to the scanning frequency A is refreshed (i.e., lost), and the resetting signal corresponding to the scanning frequency B has not been outputted yet. This may cause a part of the outputting terminals of the gate drive circuit to be unable to be reset normally. Therefore, some of display lines may always appear bright lines, which results in a poor displaying effect.

SUMMARY

According to an aspect of embodiments of the present disclosure, there is provided a resetting circuit, comprising: a first switching sub-circuit, coupled to a first terminal and a storage sub-circuit, configured to transmit an inputting signal received at the first terminal to the storage sub-circuit; the storage sub-circuit, coupled to the first switching sub-circuit and a first level signal terminal, and configured to store the inputting signal; a controlling sub-circuit, coupled to a first controlling signal terminal, the storage sub-circuit and a second switching sub-circuit, and configured to control the storage sub-circuit to transmit a signal stored therein to the second switching sub-circuit, under a control of the first controlling signal received at the first controlling signal terminal; and the second switching sub-circuit, coupled to the controlling sub-circuit, the first level signal terminal and a second terminal, and configured to output signal from the first level signal terminal to the second terminal under a control of the controlling sub-circuit.

According to another aspect of the present disclosure, there is provided a shift register, comprising: an inputting sub-circuit, coupled to an inputting signal terminal and a pulling-up node, and configured to output an inputting signal from the inputting signal terminal to the pulling-up node; an outputting sub-circuit, coupled to an outputting signal terminal and a clock signal terminal, and configured to output a gate driving signal to the outputting signal terminal under a control of a clock signal from the clock signal terminal; a pulling-down controlling sub-circuit, coupled to the first controlling signal terminal, the pulling-up node, and a pulling-down node, and configured to control the level at the pulling-down node under a control of the first controlling signal and the level at the pulling-up node; a pulling-down sub-circuit, coupled to the pulling-up node, the pulling-down node, and the outputting signal terminal, and configured to control the levels at the pulling-up node and the outputting signal terminal under a control of the level at the pulling-down node; and a first resetting sub-circuit, the first resetting sub-circuit being the resetting circuit of the embodiments of the present disclosure, wherein the resetting circuit has the first terminal coupled to the inputting signal terminal and the second terminal coupled to the pulling-up node.

According to another aspect of embodiments of the present disclosure, there is provided a gate driving circuit, comprising: a first controlling signal line; a first level signal line; and N stages of cascaded shift registers, where N is an integer greater than 1; wherein each of the N stages of cascaded shift registers comprises an inputting signal terminal, an outputting terminal, a pulling-up node, and a resetting signal terminal; wherein the $n^{th}$ stage of the shift register has its inputting signal terminal coupled to the outputting terminal of the $(n-1)^{th}$ stage of the shift register, and its outputting terminal coupled to the resetting signal terminal of the $(n-1)^{th}$ stage of the shift register, wherein n is an integer and $1 < n \leq N$; and wherein at least one shift register of the N stages of cascaded shift registers comprises a first resetting sub-circuit, the first resetting sub-circuit being the resetting circuit of the embodiments of the present disclosure, and wherein the first resetting sub-circuit has a first terminal coupled to the inputting signal terminal of the at least one shift register, a second terminal coupled to the pulling-up node of the at least one shift register, a first controlling signal terminal coupled to the first controlling signal line, and a first level signal terminal coupled to the first level signal line.

According to yet another aspect of embodiments of the present disclosure, there is provided a display apparatus comprising the gate driving circuit of the embodiments of the present disclosure.

According to still another aspect of embodiments of the present disclosure, there is provided a method for driving the resetting circuit of the embodiments of the present disclosure, the method comprising:

transmitting the inputting signal to the storage sub-circuit through the first switching sub-circuit, under a control of the inputting signal, during a first period; and controlling, by the controlling sub-circuit, to transmit the signal stored in the storage sub-circuit to the second switching sub-circuit, so as to output a signal at the first level signal terminal to the second terminal through the second switching sub-circuit, under a control of the first controlling signal, during a second period.

According to another aspect of embodiments of the present disclosure, there is provided a method for driving the gate driving circuit of the embodiments of the present disclosure, the method comprising: transmitting, by the first switching sub-circuit of the at least one shift register, an outputting signal from its previous stage of the shift register, to the storage sub-circuit; and outputting the first level signal to the pulling-up node of the at least one shift register, under a control of the first controlling signal.

BRIEF DESCRIPTION OF THE DRAWINGS

FIG. 3 shows a flow chart illustrating a method for driving a resetting circuit in accordance with the embodiments of the present disclosure;

DETAILED DESCRIPTION

In order to make objectives, features and advantages of the embodiments of the present disclosure more clearly, the embodiments of the present disclosure will be described in detail below with reference to the accompanying drawings and specific implementations.

Figure 1:
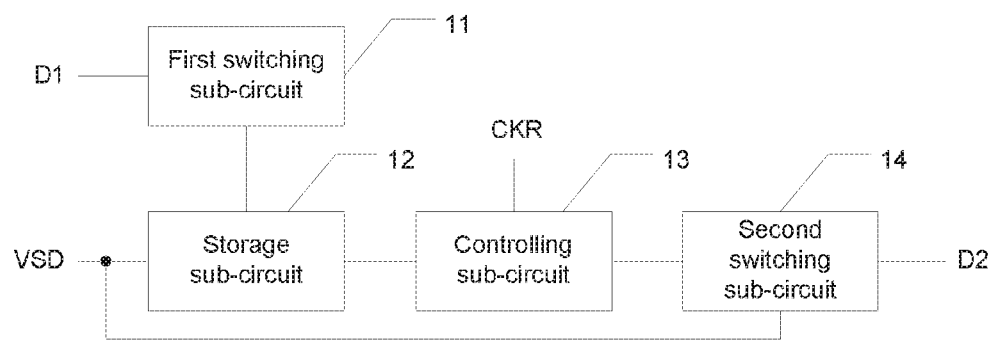
FIG. 1 shows a schematic block diagram of an example resetting circuit in accordance with embodiments of the present disclosure.

FIG. 1 shows a schematic block diagram of an resetting circuit in accordance with embodiments of the present disclosure. As shown in FIG. 1, the resetting circuit may include a first switching sub-circuit 11, a storage sub-circuit 12, a controlling sub-circuit 13 and a second switching sub-circuit 14. The first switching sub-circuit 11 is coupled to a first terminal D1 and the storage sub-circuit 12, and is configured to transmit an inputting signal received at the first terminal D1 to the storage sub-circuit 12. The storage sub-circuit 12 is coupled to the first switching sub-circuit 11 and the first level signal terminal VSD, and is configured to store the inputting signal. The controlling sub-circuit 13 is coupled to the first controlling signal terminal CKR, the storage sub-circuit 12 and the second switching sub-circuit 14, and is configured to control the storage sub-circuit 12 to transmit a signal stored therein to the second switching sub-circuit 14, under a control of the first controlling signal received at the first controlling signal terminal CKR. The second switching sub-circuit 14 is coupled to the controlling sub-circuit 13, the first level signal terminal VSD and a second terminal D2, and is configured to output signal from the first level signal terminal at the first level signal terminal VSD to the second terminal D2 under a control of the controlling sub-circuit 13.

Figure 2:
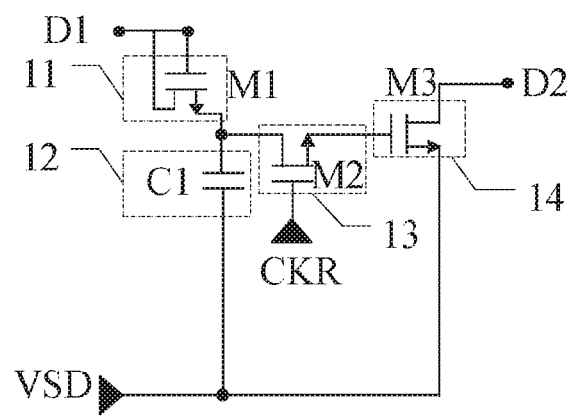
FIG. 2 shows a schematic block diagram of another example resetting circuit in accordance with the embodiments of the present disclosure.

FIG. 2 shows a schematic block diagram of another example resetting circuit in accordance with the embodiments of the present disclosure. As shown in FIG. 2, in the resetting circuit, the first switching sub-circuit 11 includes a first transistor M1 having a gate and a first electrode both coupled to the first terminal D1, and a second electrode coupled to the storage sub-circuit 12.

The storage sub-circuit 12 includes a first capacitor C1 having a first electrode coupled to the first switching sub-circuit 11 and a second electrode coupled to the first level signal terminal VSD.

The controlling sub-circuit 13 comprises a second transistor M2 having a gate coupled to the first controlling signal terminal CKR, a first electrode coupled to the storage sub-circuit 12, and a second electrode coupled to the second switching sub-circuit 14.

The second switching sub-circuit 14 comprises a third transistor M3 having a gate coupled to the controlling sub-circuit 13, a first electrode coupled to the second terminal D2, and a second electrode coupled to the first level signal terminal VSD.

The first transistor M1, the second transistor M2 and the third transistor M3 may both be N-type transistors, and the first level signal at the first level signal terminal VSD is a low level signal.

In the embodiments of the present disclosure, the signal at the first level signal terminal may be output to the second terminal of the resetting circuit through the first switching sub-circuit, the storage sub-circuit, the controlling sub-circuit and the second switching sub-circuit of the resetting circuit. Due to the presence of the resetting circuit, when switching a scanning frequency of the gate driving circuit, a resetting function may be realized by the resetting circuit even if there is no resetting signal provided by the resetting signal terminal for resetting a part of the outputting terminals of the gate driving circuit.

FIG. 3 shows a flow chart illustrating a method 30 for driving a resetting circuit in accordance with the embodiments of the present disclosure. The method is used for driving the resetting circuit shown in FIG. 1 or FIG. 2.

At step 301, during the first period, the inputting signal is transmitted to the storage sub-circuit through the first switching sub-circuit, under a control of the inputting signal.

At step 302, during the second period, the controlling sub-circuit controls to transmit the signal stored in the storage sub-circuit to the second switching sub-circuit, so as to output a signal at the first level signal terminal to the second terminal through the second switching sub-circuit.

Figure 4:
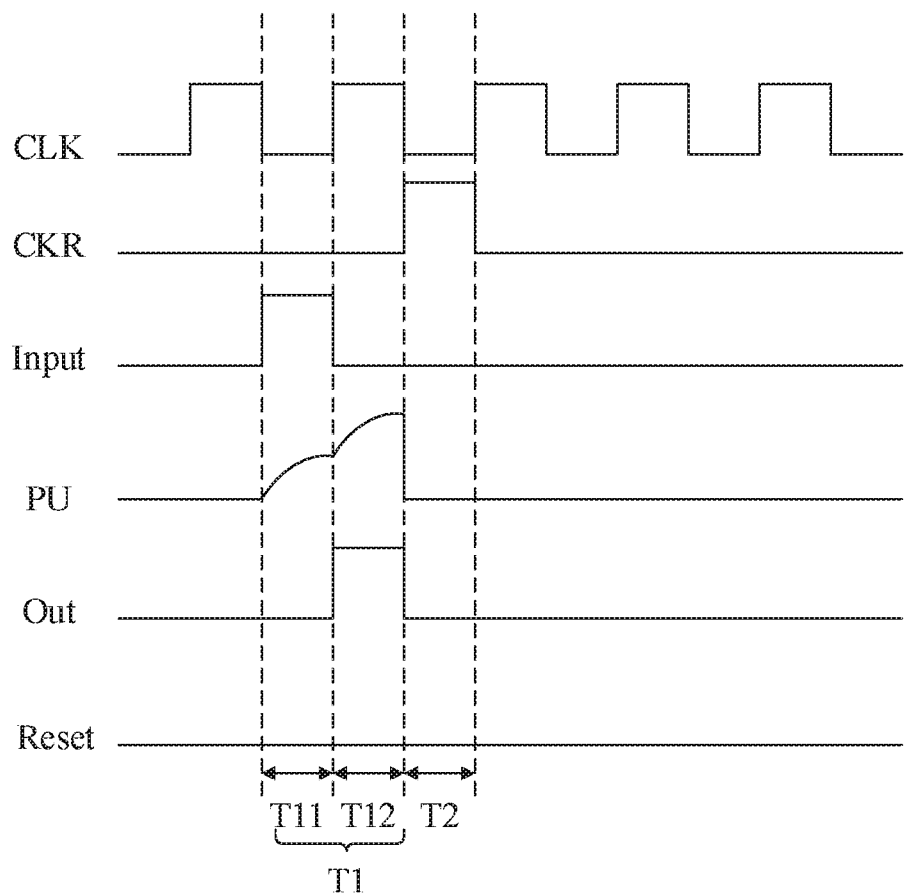
FIG. 4 shows a timing diagram of the shift register in accordance with the embodiments of the present disclosure.

FIG. 4 shows a timing diagram of the shift register in accordance with the embodiments of the present disclosure. The shift register according to the embodiments of the present disclosure includes a resetting circuit having a first terminal D1 coupled to the inputting signal terminal Input of the shift register, and a second terminal D2 coupled to a pulling-up node PU of the shift register.

As shown in FIG. 4, in the T11 sub-period of the first period T1, the inputting signal at the inputting signal terminal Input is at a high level, and the first controlling signal at the first controlling signal terminal CKR is at a low level. Under a control of the inputting signal, the first switching sub-circuit 11 is turned on, and the inputting signal is transmitted to the storage sub-circuit 12 through the first switching sub-circuit 11.

In the T12 sub-period of the first period T1, the inputting signal of the inputting signal terminal Input is at a low level, the first controlling signal at the first controlling signal terminal CKR is at a low level, and the first switching sub-circuit 11 is turned off.

During the second period T2, the inputting signal at the inputting signal terminal Input is at a low level, and the first controlling signal at the first controlling signal terminal CKR is at a high level. Under the control of the first controlling signal, the controlling sub-circuit 13 is turned on, and the signal stored in the storage sub-circuit 12 is transmitted to the second switching sub-circuit 14, so that the second switching sub-circuit 14 is turned on. Thus, the signal at the first level signal terminal VSD is outputted to the pulling-up node PU, thereby pulling down the level at the pulling-up node PU.

Figure 5:
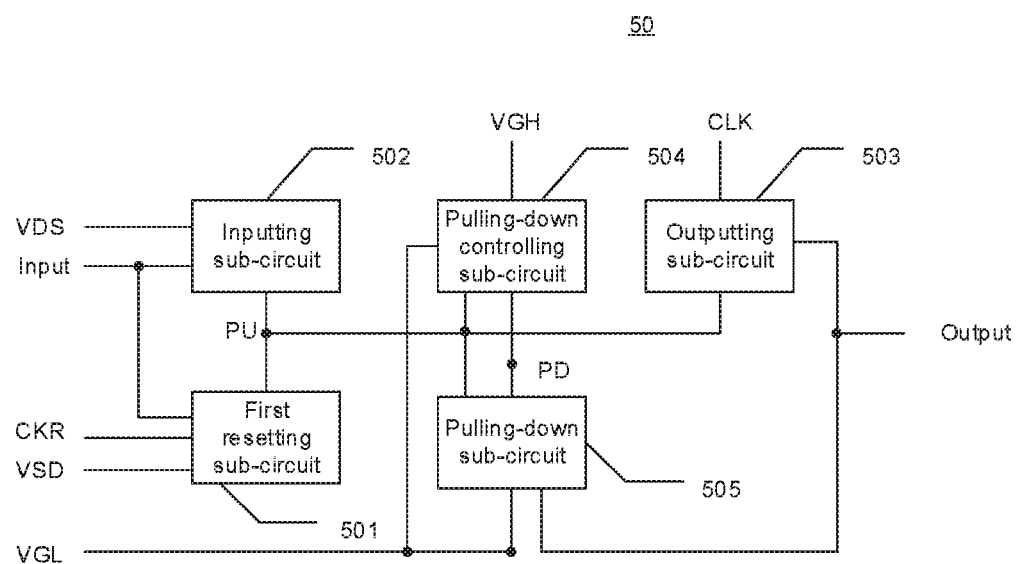
FIG. 5 shows a schematic block diagram of an example shift register in accordance with the embodiments of the present disclosure.

FIG. 5 shows an example schematic block diagram of a shift register 50 in accordance with the embodiments of the present disclosure. As shown in FIG. 5, the shift register 50 may include a first resetting sub-circuit 501, an inputting sub-circuit 502, an outputting sub-circuit 503, a pulling-down controlling sub-circuit 504 and a pulling-down sub-circuit 505.

The first resetting sub-circuit 501 may be the resetting circuit in accordance with the embodiments of the present disclosure. The first resetting sub-circuit 501 has a first terminal coupled to the inputting signal terminal Input of the shift register, a second terminal coupled to the pulling-up node PU of the shift register. Certainly, the first resetting sub-circuit 501 is also coupled to the first controlling signal terminal CKR and the first level signal terminal VSD, and is configured to input the first level signal to the pulling-up node PU under a control of the first controlling signal.

The inputting sub-circuit 502 is coupled to the inputting signal terminal Input and the pulling-up node PU, and configured to output the inputting signal from the inputting signal terminal to the pulling-up node. The outputting sub-circuit 503 is coupled to the pulling-up node PU, the clock signal terminal CLK and the outputting terminal Output, and configured to output the gate driving signal at the outputting signal terminal under a control of the clock signal from the clock signal terminal. The pulling-down controlling sub-circuit 504 is coupled to the pulling-up node PU, the pulling-down node PD, a third level signal terminal VGH and a fourth level signal terminal VGL, and configured to control the level at the pulling-down node under a control of the first controlling signal and the level at the pulling-up node. The pulling-down sub-circuit 505 is coupled to the pulling-up node PU, the pulling-down node PD, the fourth level signal terminal VGL and the outputting terminal Output, and configured to control the levels at the pulling-up node and the outputting signal terminal under a control of the level at the pulling-down node. The pulling-down controlling sub-circuit 504 controls to turn-on or turn-off the pulling-down sub-circuit 5, and to reduce the noise of the pulling-down node PD, ensuring the stability of the gate driving circuit. The pulling-down sub-circuit 505 pulls-down the levels at the pulling-up node PU and the outputting terminal Output, and reduces the noise of the signal at the outputting terminal Output.

Figure 6:
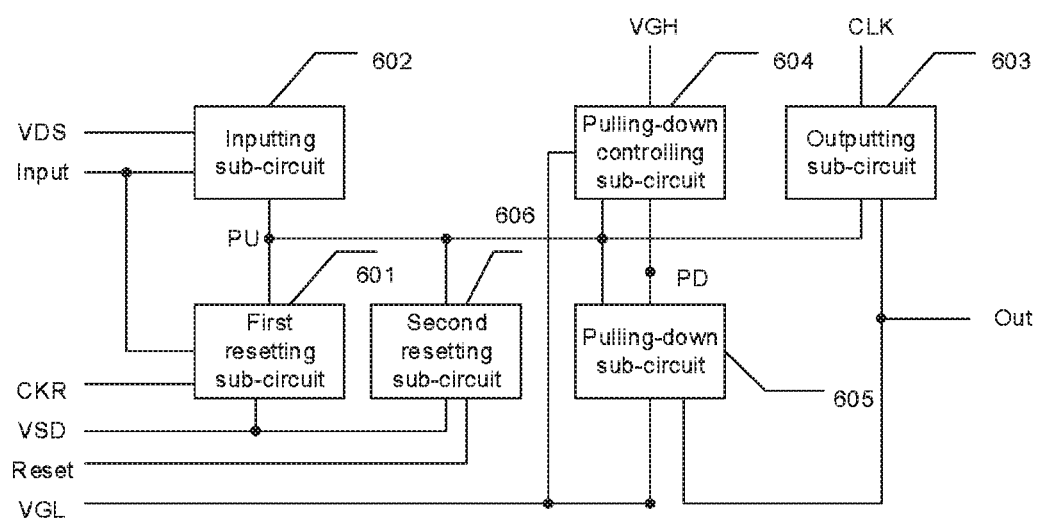
FIG. 6 shows a schematic block diagram illustrating another example shift register in accordance with the embodiments of the present disclosure.

FIG. 6 shows a schematic block diagram illustrating another example shift register in accordance with the embodiments of the present disclosure. As shown in FIG. 6, the shift register 60 further includes a second resetting sub-circuit 606 as compared to the shift register 50 shown in FIG. 5. The second resetting sub-circuit 606 is coupled to the resetting signal terminal Reset, the pulling-up node PU, and the first level signal terminal VSD. The second resetting sub-circuit 606 is configured to reset the level at the pulling-up node to the first level at the first level signal terminal under a control of the resetting signal from the resetting signal terminal.

Figure 7:
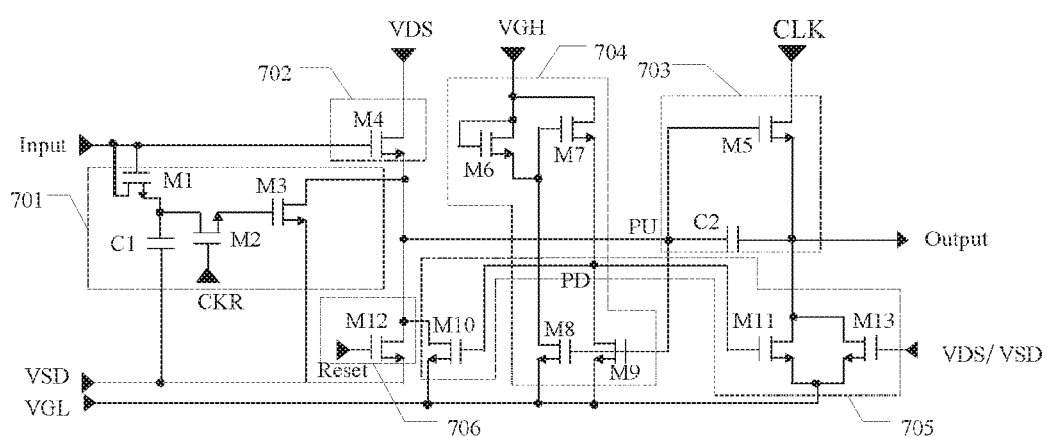
FIG. 7 shows an example circuit diagram illustrating the shift register in accordance with the embodiments of the present disclosure.

FIG. 7 shows an example circuit diagram illustrating the shift register in accordance with the embodiments of the present disclosure. According to the embodiments of the present disclosure, the first resetting sub-circuit 701 is the resetting circuit of the embodiments of the present disclosure. The first resetting sub-circuit 701 has a first terminal coupled to the inputting signal terminal Input, and a second terminal coupled to the pulling-up node PU. The first resetting sub-circuit 701 may include a first transistor M1, a first capacitor C1, a second transistor M2, and a third transistor M3. The first transistor M1 has its gate and its first electrode both coupled to the inputting signal terminal Input, and a second electrode coupled to a first electrode of the first capacitor C1. The first capacitor C1 has its second electrode coupled to the first level signal terminal VSD. The second transistor M2 has a gate coupled to the first controlling signal terminal CKR, a first electrode coupled to the first electrode of the first capacitor C1, and a second electrode coupled to a gate of the third transistor M3. The third transistor M3 has a first electrode coupled to the pulling-up node PU, and a second electrode coupled to the first level signal terminal VSD.

The inputting sub-circuit 702 may include a fourth transistor M4. The fourth transistor M4 has a gate coupled to the inputting signal terminal Input, a first electrode coupled to the second level signal terminal VDS, and a second electrode coupled to the pulling-up node PU.

The outputting sub-circuit 703 may include a second capacitor C2 and a fifth transistor M5. The second capacitor C2 has a first electrode coupled to the pulling-up node PU, and a second electrode coupled to the outputting terminal Output. The fifth transistor M5 has a gate coupled to the pulling-up node PU, a first electrode coupled to the clock signal terminal CLK, and a second electrode coupled to the outputting terminal Output.

The pulling-down controlling sub-circuit 704 may include a sixth transistor M6, a seventh transistor M7, an eighth transistor M8, and a ninth transistor M9. The sixth transistor M6 has a gate and a first electrode both coupled to the third level signal terminal VGH, and a second electrode coupled to the gate of the seventh transistor M7. The seventh transistor M7 has a first electrode coupled to the third level signal terminal VGH, and a second electrode coupled to the pulling-down node PD. The eighth transistor M8 has a gate coupled to the pulling-up node PU, a first electrode coupled to a gate of the seventh transistor M7, and a second electrode coupled to the fourth level signal terminal VGL. The ninth transistor M9 has a gate coupled to the pulling-up node PU, a first electrode coupled to the pulling-down node PD, and a second electrode coupled to the fourth level signal terminal VGL.

The pulling-down sub-circuit 705 may include a tenth transistor M10 and an eleventh transistor M11. The tenth transistor M10 has a gate coupled to the pulling-down node PD, a first electrode coupled to the pulling-up node PU, and a second electrode coupled to the fourth level signal terminal VGL. The eleventh transistor M11 has a gate coupled to the pulling-down node PD, a first electrode coupled to the outputting terminal Output, and a second electrode coupled to the fourth level signal terminal VGL.

Certainly, the pulling-down sub-circuit 705 may further include a thirteenth transistor M13. The thirteenth transistor M13 has a first electrode coupled to the outputting terminal Output, and a second electrode coupled to the fourth level signal terminal VGL. When the outputting terminal Output is at a low level, the gate of the thirteenth transistor M13 is electrically connected with the second level signal terminal VDS. When the outputting terminal Output is at a high level, the gate of the thirteenth transistor M13 is electrically connected with the first level signal terminal VSD. The thirteenth transistor M13 has a similar function as the eleventh transistor M11, which is used to pull-down the level at the outputting terminal Output. Therefore, in the embodiment of the present disclosure, the thirteenth transistor M13 is not necessary.

The second resetting sub-circuit 706 includes a twelfth transistor M12. The twelfth transistor M12 has a gate coupled to the resetting signal terminal Reset, a first electrode coupled to the pulling-up node PU, and a second electrode coupled to the first level signal terminal VSD.

According to an embodiment of the present disclosure, the first to thirteenth transistors M1 to M13 may all be N-type transistors, which are turned on when the gate is at a high level, and are turned off when the gate is at a low level. To distinguish the two electrodes except for the gate of the transistor, the drain electrode is referred to as the first electrode and the source electrode is referred to as the second electrode. The first level signal outputted at the first level signal terminal VSD is at a low level, the second level signal outputted at the second level signal terminal VDS is at a high level, the third level signal outputted at the third level signal terminal VGH is at a high level, and the fourth level signal output at the fourth level signal terminal VGL is at a low level.

The operation of the shift register shown in FIG. 7 will be briefly described below in conjunction with the timing diagram shown in FIG. 4.

During the T11 sub-period of the first period T1, the inputting signal at the inputting signal terminal Input is at a high level, the clock signal at the clock signal terminal CLK is at a low level, and the first controlling signal at the first controlling signal terminal CKR is at a low level. The fourth transistor M4 is turned on, and under the control of the second level signal terminal VDS, the level at the pulling-up node PU is pulled-up, and the second capacitor C2 is charged. At the same time, since the inputting signal terminal Input is at a high level, the first transistor M1 is turned on. The first capacitor C1 is charged under the control of the inputting signal at the inputting signal terminal Input. The third level signal terminal VGH is at a high level, and the sixth transistor M6 is turned on. Thus, the seventh transistor M7 is also turned on, and the pulling-down node PD is pulled-up by the third level signal terminal VGH. However, since the level at the pulling-up node PU is pulled-up, the eighth transistor M8 and the ninth transistor M9 are turned on, and the level at the pulling-down node PD is pulled down. At this time, the outputting terminal Output is at a low level, and the tenth transistor M10 and the eleventh transistor M11 are in an off state. If the shift register includes the thirteenth transistor M13 electrically coupled to the second level signal terminal VDS, the thirteenth transistor M13 will be turned on. Thus, the level at the outputting terminal Output is pulled down, and the signal at the outputting terminal Output will be noise-reduced. If the shift register includes the twelfth transistor M12, the twelfth transistor M12 will be in an off state.

During the T12 sub-period of the first period T1, the inputting signal at the inputting signal terminal Input is at a low level, the clock signal at the clock signal terminal CLK is at a high level, and the first controlling signal at the first controlling signal terminal CKR is at a low level. At this time, the fourth transistor M4 is turned off, the fifth transistor M5 is turned on, and the outputting terminal Output is pulled up to a high level, and the shift register outputs a gate driving signal to supply a scanning signal to gate lines connected thereto. At this time, the level of the pulling-up node PU is further pulled up due to a bootstrap of the second capacitor C2. The first transistor M13 is turned off, and the first capacitor C1 starts to discharge. However, since the first controlling signal is at a low level, the second transistor M2 is in an off state. At this time, since the level at the pulling-up node PU is further pulled-up, the sixth transistor M6, the seventh transistor M7, the eighth transistor M8, and the ninth transistor M9 are turned on, so that the pulling-down node PD is kept at a low level, the tenth transistor M10 and the eleventh transistor M11 are in an off state. At this time, the thirteenth transistor M13 is turned off, and the twelfth transistor M12 is turned off.

During the second period T2, the inputting signal at the inputting signal terminal Input is at a low level, the clock signal at the clock signal terminal CLK is at a low level, and the first controlling signal at the first controlling signal terminal CKR is at a high level. Under a control of the first controlling signal, the second transistor M2 is turned on, and the third transistor M3 is turned on due to the discharge of the first capacitor C1. Under a control of the first level signal terminal VSD, the level at the pulling-up node PU is pulled down, and the eighth transistor M8 and the ninth transistor M9 are turned off. Since the sixth transistor M6 and the seventh transistor M7 are turned on, the level at the pulling-down node PD is pulled up, thereby turning on the tenth transistor M10 and the eleventh transistor M11. Under the control of the fourth level signal terminal VGL, the levels at the pulling-up node PU and the outputting terminal Output are pulled down. Thus, the shift register does not output the gate driving signal. At this time, the fourth transistor M4 and the fifth transistor M5 are turned off. The thirteenth transistor M13 is turned on, thereby pulling-down the level of the outputting terminal and performing a noise-reduction process on the signal at the outputting terminal Output. When the resetting signal terminal Reset is at a high level, the twelfth transistor M12 is turned on. At this time, the twelfth transistor M12 has the same function as the third transistor M3, which is used to enable the resetting function. However, when the resetting signal terminal Reset is at a low level or when the resetting signal terminal does not output a signal, the twelfth transistor M12 is in an off state. In this case, the resetting function may be implemented by the third transistor M3.

For any row of shift registers, when the resetting signal terminal Reset cannot provide the resetting signal, the thin film transistor corresponding to the gate line to which the shift registers are connected is in an on state. Therefore, by adding a first resetting sub-circuit to the shift register and implementing the resetting function via the first resetting sub-circuit, the level at the outputting terminal of the shift register may be pulled down, so that the thin film transistor corresponding to the gate line to which the shift registers are connected may be turned off. In addition, when the first resetting sub-circuit is added to the shift register, the second resetting sub-circuit is not necessary, thereby simplifying the configuration of the circuit. The resetting circuit and the second resetting sub-circuit according to the embodiment of the present disclosure may both operate when the resetting signal terminal Reset may provide the resetting signal.

In the embodiment of the present disclosure, the resetting signal is inputted to the pulling-up node by providing the first resetting sub-circuit in the shift register. There is no need to change the existing circuit structure of the shift register. When the scanning frequency is switched, the resetting function may be realized by the resetting circuit even if there is no resetting signal provided by the resetting signal terminal for resetting a part of the outputting terminals of shift registers.

Another aspect of an embodiment of the present disclosure provides a gate driving circuit including a first controlling signal line, a first level signal line, and N stages of cascaded shift registers. Each of the N stages of cascaded shift registers comprises an inputting signal terminal Input, an outputting terminal Output, a pulling-up node PU, and a resetting signal terminal Reset. The $n^{th}$ stage of the shift register has its inputting signal terminal Input coupled to the outputting terminal Output of the $(n-1)^{th}$ stage of the shift register, and its outputting terminal Output coupled to the resetting signal terminal Reset of the $(n-1)^{th}$ stage of the shift register, wherein N is an integer greater than 1, and n is an integer and $1<n\leq N$.

At least one shift register of the N stages of cascaded shift registers comprises a first resetting sub-circuit, wherein the first resetting sub-circuit may be the resetting circuit of the embodiments of the present disclosure. The first resetting sub-circuit has a first terminal coupled to the inputting signal terminal Input of the at least one shift register, a second terminal coupled to the pulling-up node PU of the at least one shift register, a first controlling signal terminal CKR coupled to the first controlling signal line, and a first level signal terminal VSD coupled to the first level signal line.

Figure 8:
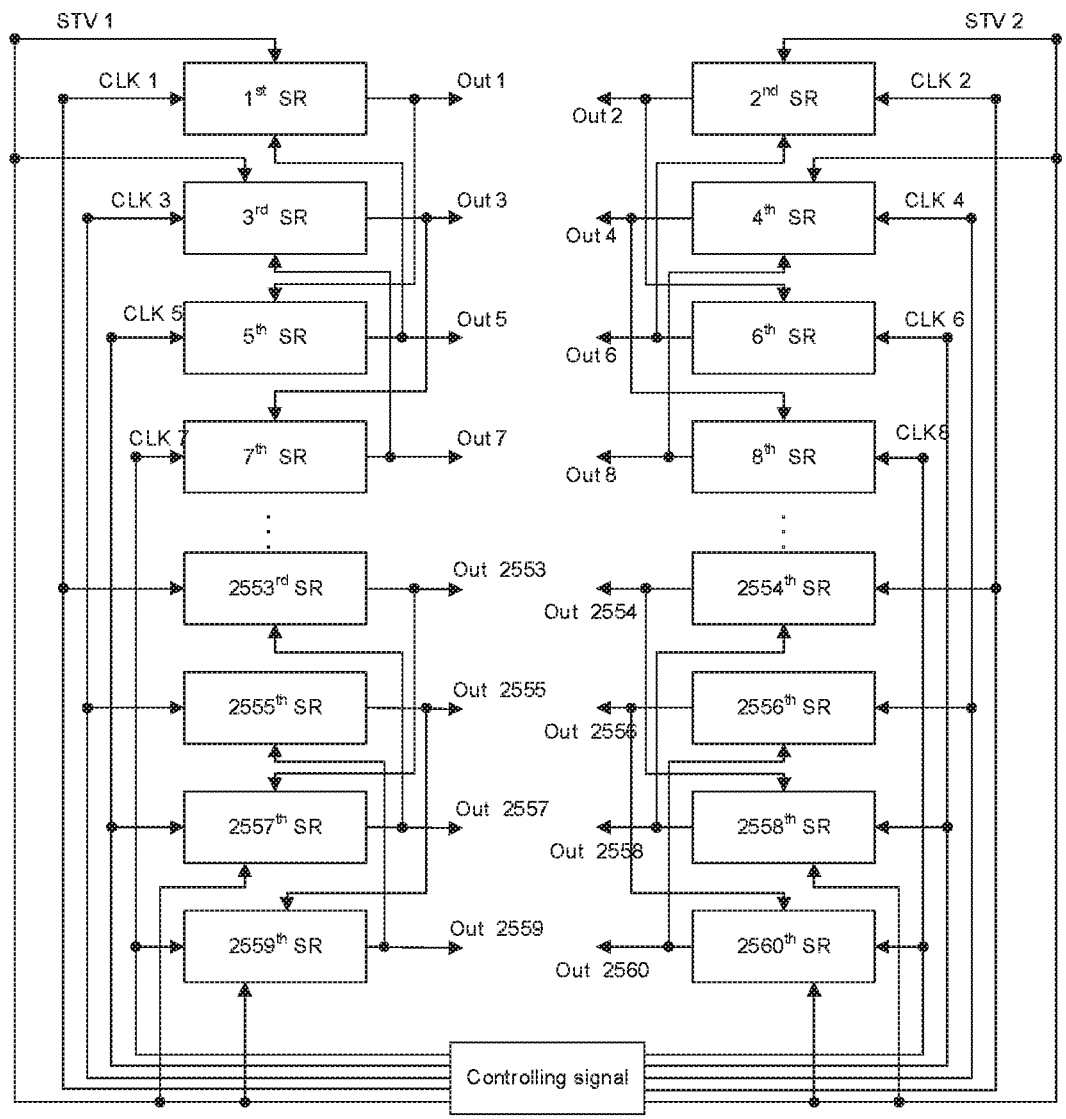
FIG. 8 shows a schematic diagram illustrating cascaded shift registers in a gate driving circuit in accordance with the embodiments of the present disclosure.

FIG. 8 shows a schematic diagram illustrating cascaded shift registers in a gate driving circuit in accordance with the embodiments of the present disclosure. The gate driving circuit bi-directionally drives a display device. The controlling signals provided by the gate driving circuit includes two triggering signals and eight clock signals. The two triggering signals are STV1 and STV2, respectively, and the eight clock signals are CLK1 to CLK8, respectively. CLK1 provides a clock signal for the $(8m-7)^{th}$ stage of the shift register SR; CLK5 provides a clock signal for the $(8m-3)^{th}$ stage of the shift register; CLK2 provides a clock signal for the $(8m-6)^{th}$ stage of the shift register; CLK6 provides a clock signal for the $(8m-2)^{th}$ stage of the shift register; CLK3 provides a clock signal for the $(8m-5)^{th}$ stage of the shift register; CLK7 provides a clock signal for the $(8m-1)^{th}$ stage of the shift register; CLK4 provides a clock signal for the $(8m-4)^{th}$ stage of the shift register; and CLK8 provides a clock signal for the $(8m)^{th}$ stage of the shift register, wherein m is a positive integer greater than or equal to 1. That is, CLK1, CLK3, CLK5 and CLK7 provide clock signals for odd-numbered stages of shift registers, and CLK2, CLK4, CLK6, and CLK8 provide clock signals for even-numbered stages of shift registers. The triggering signal STV1 is used to trigger the first stage of the shift register and the third stage of the shift register for the current picture frame, and is also used to provide the resetting signal for the $2557^{th}$ stage of the shift register and the $2559^{th}$ stage of the shift register for the previous picture frame. The triggering signal STV2 is used to trigger the second stage of the shift register and the fourth stage of the shift register for the current picture frame, and is also used to provide the resetting signal for the $2558^{th}$ stage of the shift register and the $2560^{th}$ stage of the shift register for the previous picture frame.

Figure 9:
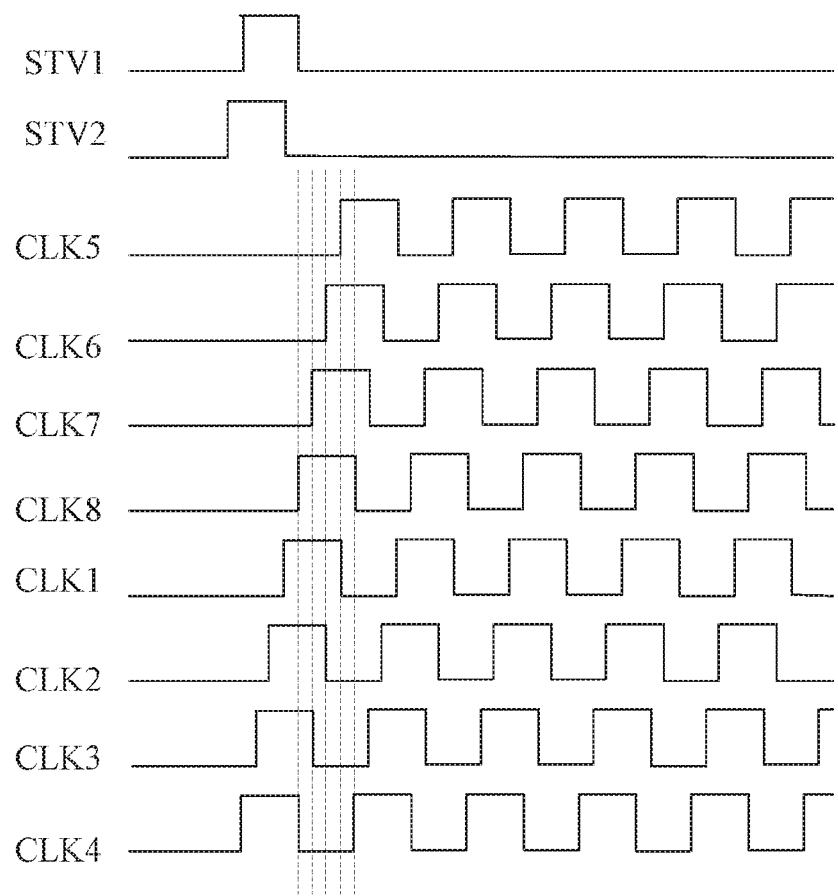
FIG. 9 shows a timing diagram illustrating signals in the gate driving circuit of FIG. 8.

FIG. 9 shows a timing diagram illustrating signals in the gate driving circuit of FIG. 8. The 8 clock signals include four sets of complementary clock signals, that is, CLK1 and CLK5 are phase-inverted signals with the same frequency, CLK2 and CLK6 are phase-inverted signals with the same frequency, CLK3 and CLK7 are phase-inverted signals with the same frequency, and CLK4 and CLK8 are phase-inverted signals with the same frequency.

According to the connection of N stages of cascaded shift registers, for the shift registers to which one set of complementary clock signals are connected, the $n^{th}$ stage of the shift register has its inputting signal terminal coupled to the outputting terminal of the $(n-1)^{th}$ stage of the shift register, and its outputting terminal coupled to the resetting signal terminal of the $(n-1)^{th}$ stage of the shift register. It should be understood that n and m represent different physical meanings in this embodiment.

The first stage of the shift register is turned on in response to the clock signal CLK1 being at a high level after receiving the triggering signal STV1. The third stage of the shift register is turned on in response to the clock signal CLK3 being at a high level after receiving the triggering signal STV1. The signal at the outputting terminal Output1 of the first stage of the shift register is used as the inputting signal of the fifth stage of the shift register. The fifth stage of the shift register is turned on in response to the clock signal CLK5 being at the high level after receiving the signal at the outputting terminal Output1, and the signal at the outputting terminal Output5 of the fifth stage of the shift register is used as the resetting signal of the first stage of the shift register. The first stage of the shift register receives the signal at the outputting terminal Output5, and then resets the signal at the outputting terminal Output1. Correspondingly, the signal at the outputting terminal Output3 of the third-stage of the shift register is used as the inputting signal of the seventh stage of the shift register. The seventh stage of the shift register is turned on in response to the clock signal CLK7 being at the high level after receiving the signal at the outputting terminal Output3. The signal at the outputting terminal Output7 of the seventh stage of the shift register is used as the resetting signal of the third stage of the shift register. The third stage of the shift register receives the signal at the outputting terminal Output7, and then resets the signal at the outputting terminal Output3. Similarly, the signal at the outputting terminal Ouput2559 of the $2559^{th}$ stage of the shift register is used as the resetting signal of the $2555^{th}$; stage of the shift register, and the signal at the outputting terminal Output2557 of the $2557^{th}$ stage of the shift register is used as the resetting signal of the $2553^{th}$ stage of the shift register.

Therefore, when switching the scanning frequency, for the $2557^{th}$ stage of the shift register and the $2559^{th}$ stage of the shift register, the resetting signal under the previous scanning frequency has been replaced, and the resetting signal corresponding to a next scanning frequency has not been arrived. Therefore, the outputting signals of the $2557^{th}$ stage of the shift register and the $2559^{th}$ stage of the shift register are always at a high level, so that the thin film transistors corresponding to the gate lines coupled to the $2557^{th}$ stage of the shift register and the $2559^{th}$ stage of the shift register are always turned on. For the odd-numbered pixel units, the last two rows are in the bright line state.

Similarly, the even-numbered stages of shift registers work similarly to the odd-numbered stages of shift registers. Thus, it will not be described in detail herein. Therefore, the outputting signals of the $2558^{th}$ stage of the shift register and the $2560^{th}$ stage of the shift register are always at a high level, so that the thin film transistors corresponding to the gate lines coupled to the $2558^{th}$ stage of the shift register and the $2560^{th}$ stage of the shift register are always turned on. For the even-numbered pixel units, the last two rows are in the bright line state.

Therefore, the cascaded gate driving circuit shown in FIG. 8 in this embodiment causes the last four rows to be in a bright line state after switching the scanning frequency. By setting a resetting circuit in accordance with the embodiments of the present disclosure in for example the last four stages of shift registers, the pulling-up node is input with a resetting signal, thereby pulling the levels at the outputting terminals of the last four stages of shift registers down. Certainly, the first resetting sub-circuit may also be set in each stage of the shift register.

It may be understood that when the first resetting sub-circuit is set in the shift register, it is also necessary to set the first controlling signal line and the first level signal line respectively. The first controlling signal line is coupled to the first controlling signal terminal of the first resetting sub-circuit for providing the first controlling signal to the first controlling signal terminal of the first resetting sub-circuit. The first level signal line is coupled to the first level signal terminal of the first resetting sub-circuit for providing the first level signal to the first level signal terminal of the first resetting sub-circuit. In order to save wiring space, shift registers provided with first resetting sub-circuits may share one first level signal line.

Figure 10:
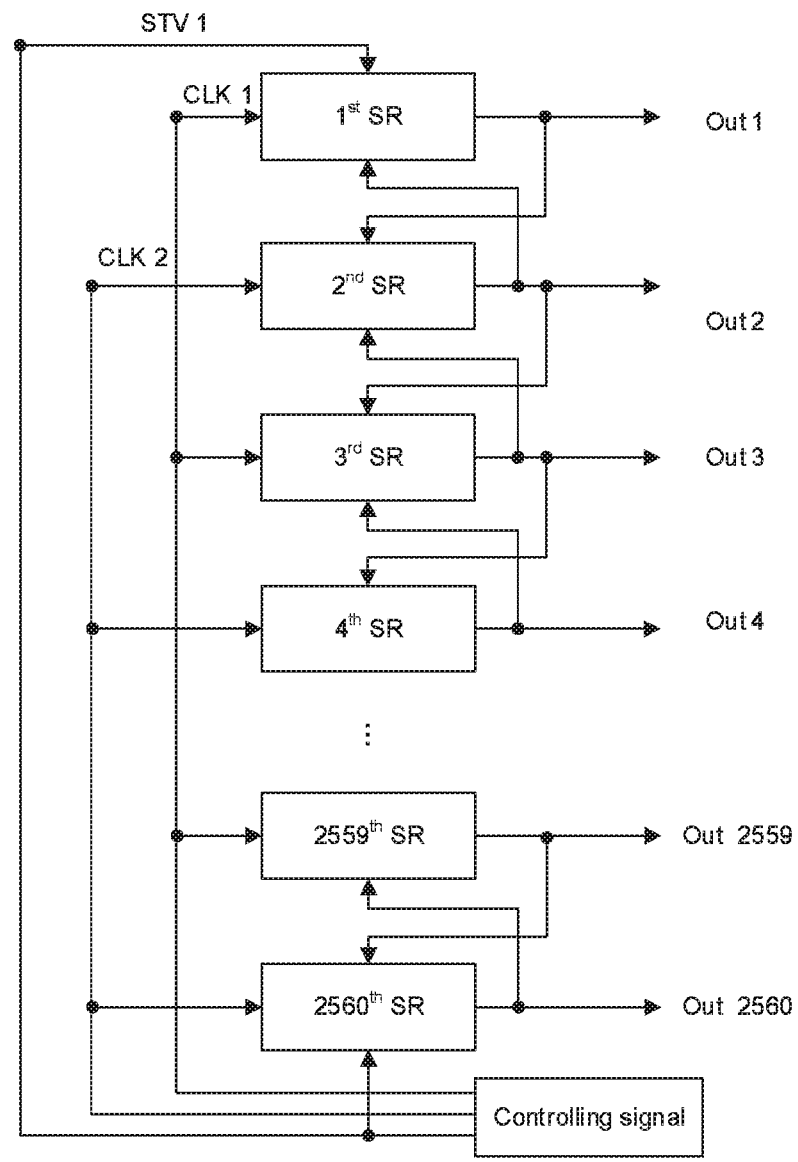
FIG. 10 shows a schematic diagram illustrating the cascaded shift registers in another gate driving circuit in accordance with the embodiments of the present disclosure.
Figure 11:
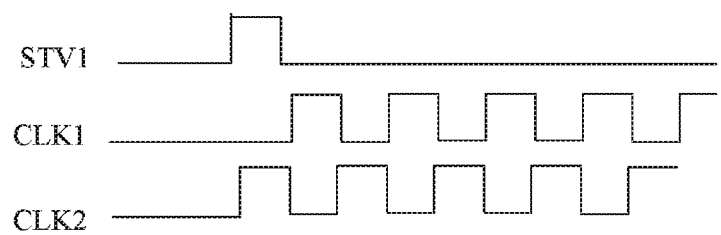
FIG. 11 shows a timing diagram illustrating signals in the gate driving circuit of FIG. 10.

FIG. 10 shows a schematic diagram illustrating the cascaded shift registers in another gate driving circuit in accordance with the embodiments of the present disclosure. FIG. 11 shows a timing diagram illustrating signals in the gate driving circuit of FIG. 10. As shown in FIG. 11, CLK1 provides a clock signal for the odd-numbered stages of shift registers, CLK2 provides a clock signal for the even-numbered stages of shift registers, and the triggering signal STV1 is used to trigger the first stage of the shift register, and is also used to provide the resetting signal for the $2560^{th}$ stage of the shift register.

The first stage of the shift register is turned on in response to the clock signal CLK1 being at a high level after receiving the triggering signal STV1. The signal at the outputting terminal Output1 of the first stage of the shift register is used as an inputting signal of the second stage of the shift register. The second stage of the shift register is turned on in response to the clock signal CLK2 being at a high level after receiving the signal at the outputting terminal Output1. The signal at the outputting terminal Output2 of the second stage of the shift register is used as the resetting signal of the first stage of the shift register. The first stage of the shift register resets the signal at the outputting terminal Output1 after receiving the signal at the outputting terminal Output2. Similarly, the signal at the outputting terminal Output2560 of the $2560^{th}$; stage of the shift register is used as the resetting signal of the $2559^{th}$ stage of the shift register. Therefore, after switching the scanning frequency, the resetting signal of the $2560^{th}$; stage of the shift register is lost, the outputting signal of the $2560^{th}$; stage of the shift register is always at a high level. Therefore, the last row is in a bright line state.

According to the embodiment of the present disclosure, by providing the first resetting sub-circuit in for example the last stage of the shift register, it is possible to avoid the occurrence of endmost bright line caused by switching the scanning frequency, and to improve a displaying effect of the display device.

It may be understood that since the plurality of shift registers constitutes the gate driving circuit in different cascaded manners, the number of the rows which may appear the bright lines after switching the scanning frequency may correspond to the number of clock signals included therein.

The above description only exemplifies the case where the one stage of the shift register drives one row of gate lines. For a large-sized display device, since the gate lines generally have a large load, a multilateral driving may be employed in order to turn on the gate line normally. For example, for a row of gate line, there will be shift registers on both the left and right sides of the gate line, so as to charge the gate line. The shift registers on the left and right sides are completely symmetrical, and the corresponding controlling signals on the left and right sides are the same. Therefore, when a set of clock signals are respectively input to the left and right sides, the endmost bright line may be occurred in the last row. Therefore, the first resetting sub-circuits may be set in the shift registers on the left and right sides of the last row of gate line.

In the embodiment of the present disclosure, by providing the first resetting sub-circuit in the $n^{th}$ stage of the shift register, the pulling-up node is input with a resetting signal. When the scanning frequency of the gate driving circuit is switched, the resetting function may be realized by the resetting circuit even if there is no resetting signal provided by the resetting signal terminal for resetting a part of the outputting terminals of shift registers. It is possible to avoid the occurrence of bright line caused by switching the scanning frequency, and to further improve a displaying effect of the display device.

Embodiments of the present disclosure also provide a display device including the above-described gate driving circuit.

Figure 12:
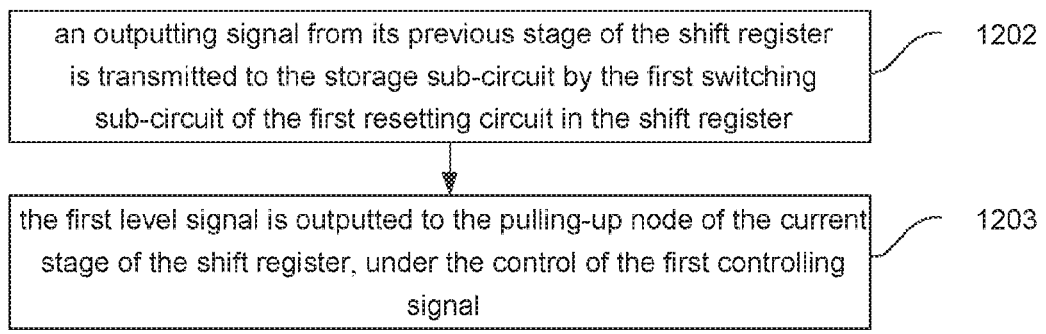
FIG. 12 shows a flow chart showing a method for driving a gate driving circuit in accordance with the embodiments of the present embodiment.

FIG. 12 shows a flow chart showing a method for driving a gate driving circuit in accordance with the embodiments of the present embodiment. The method may be used to drive the gate driving circuit according to the embodiments of the present disclosure. As illustrated in FIG. 12, the method 120 for driving the gate driving circuit according to the embodiment of the present disclosure may include the following steps.

At step 1201, an outputting signal from its previous stage of the shift register is transmitted to the storage sub-circuit by the first switching sub-circuit of the first resetting circuit in the shift register.

According to the embodiment of the present disclosure, when the previous stage of the shift register outputs a gate driving signal, the current stage of the shift register receives an outputting signal from the previous stage of the shift register as an inputting signal. When the outputting signal from the previous stage of the shift register is at a high level, the first switching sub-circuit 11 in the current stage of the shift register is turned on, so as to transmit the outputting signal from the previous stage of the shift register to the storage sub-circuit 12 in the current stage of the shift register.

For example, in the cascaded gate driving circuit shown in FIG. 8, the $2555^{th}$; stage of the shift register is the previous stage of the shift register, and the $2559^{th}$; stage of the shift register is the current stage of the shift register. The outputting signal at the outputting terminal Output 2555 of the 2555th stages of shift register is used as the inputting signal of the $2559^{th}$; stage of the shift register. In the $2559^{th}$; stage of the shift register, when the inputting signal is at a high level, the first switching sub-circuit 11 is turned on. Thus, the outputting signal of the $2555^{th}$; stage of the shift register is transmitted to the storage sub-circuit 12.

At step 1202, the first level signal is outputted to the pulling-up node of the current stage of the shift register, under the control of the first controlling signal.

According to an embodiment of the present disclosure, for the current stage of the shift register, after transmitting the outputting signal of the previous stage of the shift register to the storage sub-circuit 12, its inputting signal is at a low level, so that the first switching sub-circuit 11 is turned off. At the same time, the clock signal at the clock signal terminal CLK is at a high level, so that the outputting sub-circuit 3 is turned on, and the clock signal is outputted to the outputting terminal of the current stage of the shift register.

For the current stage of the shift register, the first controlling signal line is coupled to the first controlling signal terminal. After the current stage of the shift register outputs the gate driving signal, the controlling sub-circuit 13 is turned on under the control of the first controlling signal, and the signal stored in the storage sub-circuit 12 is transmitted to the second switching sub-circuit 14, so that the second switching sub-circuit 14 is turned on. The first level signal at the first level signal terminal VSD is outputted to the pulling-up node PU, thereby pulling the level at the pulling-up node PU down. This will further cause the level at the pulling-down node PD to be pulled-up. Thus, the pulling-down sub-circuit 5 is turned on, so that the levels at the pulling-up node PU and the outputting terminal Output are pulled-down.

For example, in the gate driving circuit shown in FIG. 8, the 2559th stage of the shift register is the current stage of gate driving circuit. After transmitting the output signal of the $2555^{th}$; stage of the shift register to the storage sub-circuit 12, the clock signal is outputted to the outputting terminal of the $2559^{th}$; stage of the shift register through the outputting sub-circuit 3 of the $2559^{th}$; stage of the shift register. Then, the signal stored in the storage sub-circuit 12 is transmitted to the second switching sub-circuit 14 through the controlling sub-circuit 13 of the $2559^{th}$; stage of the shift register, so that the second switching sub-circuit 14 is turned on, and the first level signal at the first-level signal terminal VSD is outputted to the pulling-up node PU, thereby pulling-down the level at the pulling-up node PU. Thus, the level at the pulling-down node PD is pulled-up, and the pulling-down sub-circuit 5 is turned on, so that the levels at the pulling-up node PU and the outputting terminal Output 2559 of the $2559^{th}$; stage of the shift register are both pulled-down.

In addition, according to an embodiment of the present disclosure, the inputting signal terminal of the first stage of the shift register is coupled to the triggering signal line. When the inputting signal terminal of the first stage of the shift register receives the triggering signal, it is turned on in response to the clock signal at the clock signal terminal CLK being at the high level, and the outputting terminal Output1 of the first stage of the shift register outputs the high level. The $N^{th}$ stage of the shift register has its inputting signal terminal coupled to the outputting terminal of the $(N-1)^{th}$ stage of the shift register, and its outputting terminal coupled to the resetting signal terminal of the $(N-1)^{th}$ stage of the shift register.

According to an embodiment of the present disclosure, when the previous stage of the shift register outputs the gate driving signal, the outputting signal from the previous stage of the shift register is transmitted to the storage sub-circuit through the first switching sub-circuit. After the current stage of the shift register outputs the gate driving signal, the first level signal is outputted to the pulling-up node of the current stage of the shift register, under the control of the first controlling signal. The resetting signal is input to the pulling up node by providing the first resetting sub-circuit in the shift register. When the scanning frequency of the gate driving circuit is switched, the resetting function may be realized by the resetting circuit according to the embodiments of the present disclosure, even if there is no resetting signal provided by the resetting signal terminal for resetting a part of the outputting terminals of the gate driving circuit.

The various embodiments in the present specification are described in a progressive manner, and each embodiment focuses on differences from other embodiments, and the same or similar parts among the various embodiments may be referred to each other.

Finally, it should also be noted that in this context, relational terms such as first and second are used merely to distinguish one entity or operation from another entity or operation, and do not necessarily require or imply that there is any such actual relationship or order between those entities or operations. Furthermore, the terms "include", "comprise" or any other variations thereof are intended to cover a non-exclusive inclusion such that a process, method, article, or apparatus that includes a series of elements includes not only those listed elements but also include other elements that are not listed explicitly, and elements which are inherent to such process, method, article, or apparatus. Without further limitations, an element limited by the expression "including a . . . " does not exclude the existence of additional identical elements in the process, method, article, or apparatus that includes the element.

The resetting circuit, the shift register, the driving method thereof and the display device provided by the present disclosure are described in detail above. The principle and implementations of the present disclosure has been described with reference to the specific embodiments of the present disclosure. The above description of the embodiments is only intended to help in the understanding of the inventive concepts of the disclosure, and should not be construed as limiting the disclosure. It will be understood by those of ordinary skilled in the art that all modifications or modified forms derived based on the technical ideas of the present disclosure are included within the scope of the present invention, without departing from the spirit of the disclosure.

I claim:

1. A resetting circuit, comprising:
    a first switching sub-circuit, coupled to a first terminal and a storage sub-circuit, configured to transmit an inputting signal received at the first terminal to the storage sub-circuit;
    the storage sub-circuit, coupled to the first switching sub-circuit and a first level signal terminal, and configured to store the inputting signal;
    a controlling sub-circuit, coupled to a first controlling signal terminal, the storage sub-circuit and a second switching sub-circuit, and configured to control the storage sub-circuit to transmit a signal stored therein to the second switching sub-circuit, under a control of a first controlling signal received at the first controlling signal terminal; and
    the second switching sub-circuit, coupled to the controlling sub-circuit, the first level signal terminal and a second terminal, and configured to output signal from the first level signal terminal to the second terminal under a control of the controlling sub-circuit.

2. The resetting circuit of claim 1, wherein the first switching sub-circuit comprises a first transistor having a gate and a first electrode both coupled to the first terminal, and a second electrode coupled to the storage sub-circuit.

3. The resetting circuit of claim 1, wherein the storage sub-circuit comprises a first capacitor having a first electrode coupled to the first switching sub-circuit and a second electrode coupled to the first level signal terminal.

4. The resetting circuit of claim 1, wherein the controlling sub-circuit comprises a second transistor having a gate coupled to the first controlling signal terminal, a first electrode coupled to the storage sub-circuit, and a second electrode coupled to the second switching sub-circuit.

5. The resetting circuit of claim 1, wherein the second switching sub-circuit comprises a third transistor having a gate coupled to the controlling sub-circuit, a first electrode coupled to the second terminal, and a second electrode coupled to the first level signal terminal.

6. The resetting circuit of claim 2, wherein the first transistor is an N-type transistor.

7. The resetting circuit of claim 4, wherein the second transistor is an N-type transistor.

8. The resetting circuit of claim 5, wherein the third transistor is an N-type transistor.

9. A shift register, comprising:
   an inputting sub-circuit, coupled to an inputting signal terminal and a pulling-up node, and configured to output an inputting signal from the inputting signal terminal to the pulling-up node;
   an outputting sub-circuit, coupled to an outputting signal terminal and a clock signal terminal, and configured to output a gate driving signal to the outputting signal terminal under a control of a clock signal from the clock signal terminal;
   a pulling-down controlling sub-circuit, coupled to the pulling-up node and a pulling-down node, and configured to control the level at the pulling-down node under a control of the level at the pulling-up node;
   a pulling-down sub-circuit, coupled to the pulling-up node, the pulling-down node, and the outputting signal terminal, and configured to control the levels at the pulling-up node and the outputting signal terminal under a control of the level at the pulling-down node; and
   a first resetting sub-circuit, the first resetting sub-circuit being the resetting circuit of claim 1, wherein the resetting circuit has the first terminal coupled to the inputting signal terminal and the second terminal coupled to the pulling-up node.

10. The shift register of claim 9, further comprising a second resetting sub-circuit, coupled to a resetting signal terminal, the pulling-up node, and the first level signal terminal, and configured to reset the level at the pulling-up node to a first level at the first level signal terminal under a control of the resetting signal from the resetting signal terminal.

11. The shift register of claim 9, wherein the inputting sub-circuit comprises a fourth transistor having a gate coupled to the inputting signal terminal, a first electrode coupled to a second level signal terminal and a second electrode coupled to the pulling-up node.

12. The shift register of claim 9, wherein the outputting sub-circuit comprises a second capacitor and a fifth transistor;
   wherein the second capacitor has a first terminal coupled to the pulling-up node and a second terminal coupled to the outputting signal terminal; and
   wherein the fifth transistor has a gate coupled to the pulling-up node, a first electrode coupled to the clock signal terminal and a second electrode coupled to the outputting signal terminal.

13. The shift register of claim 9, wherein the pulling-down controlling sub-circuit comprises a sixth transistor, a seventh transistor, an eighth transistor, and a ninth transistor;
   wherein the sixth transistor has a gate and a first electrode coupled to a third level signal terminal, and a second electrode coupled to a gate of the seventh transistor;
   wherein the seventh transistor has a first electrode coupled to the third level signal terminal and a second electrode coupled to the pulling-down node;
   wherein the eighth transistor has a gate coupled to the pulling-up node, a first electrode coupled to the gate of the seventh transistor, and a second electrode coupled to a fourth level signal terminal; and
   wherein the ninth transistor has a gate coupled to the pulling-up node, a first electrode coupled to the pulling-down node, and a second electrode coupled to the fourth level signal terminal.

14. The shift register of claim 9, wherein the pulling-down sub-circuit comprises a tenth transistor and an eleventh transistor;
   wherein the tenth transistor has a gate coupled to the pulling-down node, a first electrode coupled to the pulling-up node, and a second electrode coupled to the fourth level signal terminal; and
   wherein the eleventh transistor has a gate coupled to the pulling-down node, a first electrode coupled to the outputting signal terminal, and a second electrode coupled to the fourth level signal terminal.

15. The shift register of claim 10, wherein the second resetting sub-circuit comprises a twelfth transistor having a gate coupled to the resetting signal terminal, a first electrode coupled to the pulling-up node, and a second electrode coupled to the first level signal terminal.

16. The shift register of claim 14, wherein the pulling-down sub-circuit further comprises a thirteenth transistor having a first electrode coupled to the outputting signal terminal, a second electrode coupled to the fourth level signal terminal, and a gate coupled to the first level signal terminal or the second level signal terminal.

17. A gate driving circuit, comprising:
   a first controlling signal line;
   a first level signal line; and
   N stages of cascaded shift registers, where N is an integer greater than 1;
   wherein each of the N stages of cascaded shift registers comprises an inputting signal terminal, an outputting terminal, a pulling-up node, and a resetting signal terminal;
   wherein the $n^{th}$ stage of the shift register has its inputting signal terminal coupled to the outputting terminal of the $(n-1)^{th}$ stage of the shift register, and its outputting terminal coupled to the resetting signal terminal of the $(n-1)^{th}$ stage of the shift register, wherein n is an integer and $1 < n \le N$; and
   wherein at least one shift register of the N stages of cascaded shift registers comprises a first resetting sub-circuit, the first resetting sub-circuit being the resetting circuit of claim 1, and
   wherein the first terminal of the first resetting sub-circuit is coupled to the inputting signal terminal of the at least one shift register, the second terminal of the first resetting sub-circuit is coupled to the pulling-up node of the at least one shift register, the first controlling signal terminal of the first resetting sub-circuit is coupled to the first controlling signal line, and the first level signal terminal of the first resetting sub-circuit is coupled to the first level signal line.

18. A display apparatus comprising the gate driving circuit of claim 17.

19. A method for driving the gate driving circuit of claim 17, the method comprising:

transmitting, by the first switching sub-circuit of the at least one shift register, an outputting signal from its previous stage of the shift register, to the storage sub-circuit; and outputting the first level signal to the pulling-up node of the at least one shift register, under a control of the first controlling signal.

20. A method for driving a resetting circuit, the resetting circuit comprises a first switching sub-circuit, coupled to a first terminal and a storage sub-circuit, and configured to transmit an inputting signal received at the first terminal to the storage sub-circuit; the storage sub-circuit, coupled to the first switching sub-circuit and a first level signal terminal, and configured to store the inputting signal; a controlling sub-circuit, coupled to a first controlling signal terminal, the storage sub-circuit and a second switching sub-circuit, and configured to control the storage sub-circuit to transmit a signal stored therein to the second switching sub-circuit, under a control of a first controlling signal received at the first controlling signal terminal; and the second switching sub-circuit, coupled to the controlling sub-circuit, the first level signal terminal and a second terminal, and configured to output a signal from the first level signal terminal to the second terminal under a control of the controlling sub-circuit, the method comprising:

transmitting the inputting signal to the storage sub-circuit through the first switching sub-circuit, under a control of the inputting signal, during a first period; and controlling, by the controlling sub-circuit, to transmit the signal stored in the storage sub-circuit to the second switching sub-circuit, so as to output the signal from the first level signal terminal to the second terminal through the second switching sub-circuit, under a control of the first controlling signal, during a second period.

* * * * *